United States Patent
Kuraguchi

(10) Patent No.: US 8,841,210 B1
(45) Date of Patent: Sep. 23, 2014

(54) SEMICONDUCTOR DEVICE MANUFACTURING METHOD AND SEMICONDUCTOR DEVICE

(71) Applicant: Kabushiki Kaisha Toshiba, Tokyo (JP)

(72) Inventor: Tomomi Kuraguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,557

(22) Filed: Sep. 3, 2013

(30) Foreign Application Priority Data

Mar. 22, 2013 (JP) .................................. 2013-061141

(51) Int. Cl.
*H01L 21/4763* (2006.01)

(52) U.S. Cl.
USPC ........................... 438/622; 438/625; 438/650

(58) Field of Classification Search
USPC ......... 438/622, 625, 627, 637, 642, 643, 648, 438/650, 653, 656, 685–688
See application file for complete search history.

(56) References Cited

U.S. PATENT DOCUMENTS

| | | | |
|---|---|---|---|
| 5,290,733 A | 3/1994 | Hayasaka et al. | |
| 6,334,942 B1 * | 1/2002 | Haba et al. | 205/122 |
| 6,517,893 B2 * | 2/2003 | Abys et al. | 29/840 |
| 6,524,892 B1 * | 2/2003 | Kishimoto et al. | 438/120 |
| 6,759,599 B2 * | 7/2004 | Tatoh et al. | 174/261 |
| 7,304,249 B2 * | 12/2007 | Lee et al. | 174/267 |
| 7,332,813 B2 | 2/2008 | Ueno | |
| 8,067,310 B2 | 11/2011 | Imamura et al. | |
| 8,154,129 B2 * | 4/2012 | Okada et al. | 257/762 |
| 2005/0009340 A1 | 1/2005 | Saijo et al. | |

FOREIGN PATENT DOCUMENTS

| | | |
|---|---|---|
| EP | 1 003 209 A1 | 5/2000 |
| JP | 2000-150518 A | 5/2000 |

* cited by examiner

*Primary Examiner* — Kevin M Picardat

(74) *Attorney, Agent, or Firm* — Patteerson & Sheridan LLP

(57) ABSTRACT

According to one embodiment, a semiconductor device manufacturing method includes: forming a film to be a first metal layer on a substrate where an element portion is formed; forming a first insulating layer provided with an opening on the film to be the first metal layer; forming a second metal layer in the opening of the first insulating layer; eliminating the first insulating layer; eliminating the film to be the first metal layer with the second metal layer used as a mask so as to form the first metal layer; and forming an electrode portion by covering exposed surfaces of the first metal layer and the second metal layer with a third metal layer including a metal of a smaller ionization tendency than the metal of the second metal layer.

18 Claims, 10 Drawing Sheets

US 8,841,210 B1

SEMICONDUCTOR DEVICE MANUFACTURING METHOD AND SEMICONDUCTOR DEVICE

CROSS-REFERENCE TO RELATED APPLICATION

This application is based upon and claims the benefit of priority from Japanese Patent Application No. 2013-061141, filed Mar. 22, 2013, the entire contents of which are incorporated herein by reference.

FIELD

Embodiments described herein relate to a semiconductor device manufacturing method and a semiconductor device.

BACKGROUND

An electrode portion provided in a semiconductor device has to be formed thicker according to the recent trend of a larger current capacity and a higher speed. As a result, the number of processes in manufacturing a semiconductor device increases if a rewiring technique is used to thicken the electrodes after the semiconductor element is formed. In this case, an unstable (reactive and active) metal of the electrode is exposed to ambient conditions, erosion easily occurs due to humidity in the ambient air, and there is a fear of deteriorating the reliability of the device. Therefore, when an electrode portion is formed using copper (Cu) or the like, a follow on manufacturing process of covering the surface of the electrode portion with metal (Au) or the like is employed.

DETAILED DESCRIPTION

Figure 1:
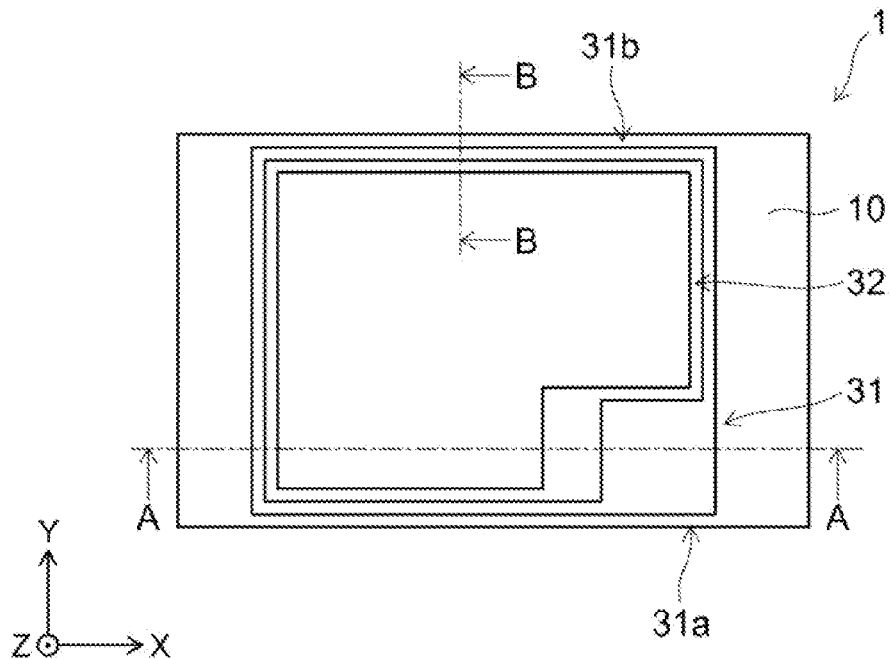
FIG. 1 is a plan view showing an example of a semiconductor device according to a first embodiment.

In order to solve the problem, according to an embodiment, there is provided a semiconductor device manufacturing method and a semiconductor device capable of reducing the number of manufacturing processes without causing deterioration of the reliability of the semiconductor device.

In general, according to one embodiment, a semiconductor device manufacturing method includes: forming a metal layer film where an element portion is formed; forming a first insulating layer thereover provided with an opening in the film to the first metal layer; forming a second metal layer in the opening of the first insulating layer; eliminating the first insulating layer; removing portion the first metal layer using the second metal layer as a mask; and forming an electrode portion by covering exposed surfaces of the first metal layer and the second metal layer with a third metal layer including a metal of a smaller ionization (oxidation) tendency than the metal of the second metal layer.

Hereinafter, embodiments will be described, with reference to the drawings.

The drawings are schematic or conceptual and a relation between thickness and width and sizes of the features may not be to relative scale. Even if the same features or elements are shown in the drawings, the mutual sizes and relative ratios thereof may be expressed differently in different drawings.

Arrows X, Y, and Z in the drawings indicate three directions mutually crossing at right angle; for example, in FIG. 1 the arrow X and the arrow Y indicates the direction in parallel to the surface of a substrate 2 and the arrow Z indicates the direction vertical (stacking direction) to the surface of the substrate 2.

In the specification and the drawings, the same elements as mentioned previously have the same reference symbols attached thereto and their detailed description is therefore omitted.

Hereinafter, a description will be made with relation to a vertical MOSFET (Metal-Oxide-Semiconductor Field-Effect Transistor) by way of example of a semiconductor device 1 according to the embodiments.

The semiconductor device 1 according to the embodiments is not restricted to a vertical MOSFET but it can be widely applied to a semiconductor device including a thick electrode portion. For example, a vertical IGBT (Insulated Gate Bipolar Transistor) can be used as the semiconductor device 1 according to the embodiments.

Here, at first, the semiconductor device 1 that can be manufactured by a semiconductor device manufacturing method according to the embodiments will be described.

First Embodiment

FIG. 1 is a plan view showing an example of the semiconductor device 1 according to the first embodiment. In FIG. 1, an insulating layer 39 (corresponding to an example of a second insulating layer) is omitted for the sake of a clear view.

Figure 2:
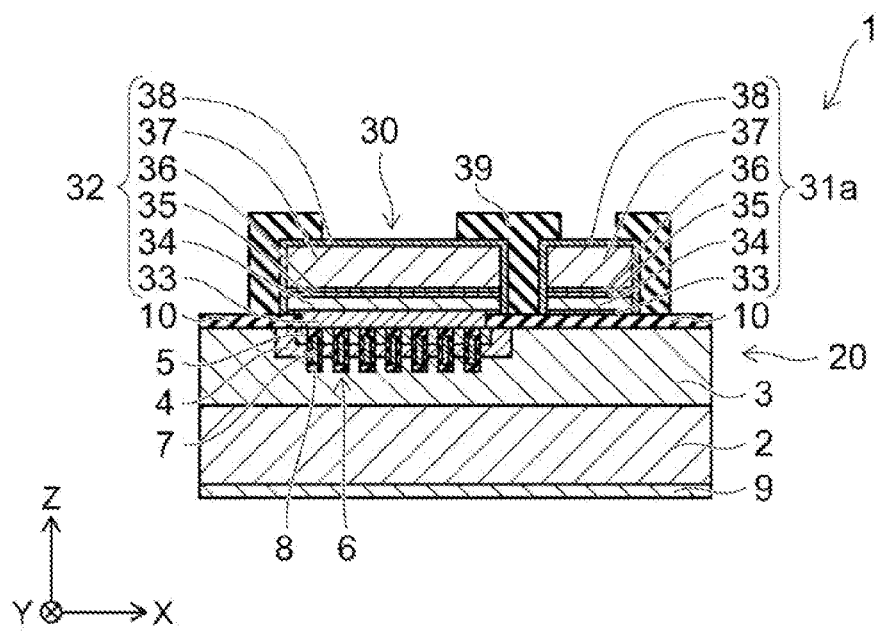
FIG. 2 is a cross sectional view of the semiconductor device taken along the line A-A shown in FIG. 1.

FIG. 2 is a cross sectional view of the semiconductor device 1 taken along the line A-A shown in FIG. 1.

Figure 3:
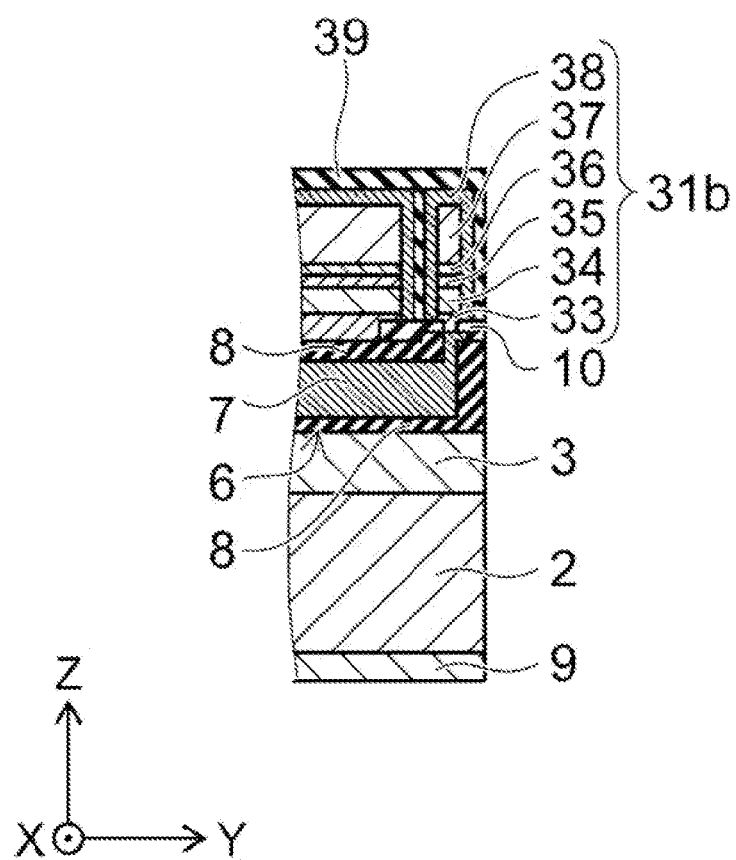
FIG. 3 is a cross sectional view of the semiconductor device taken along the line B-B shown in FIG. 1.

FIG. 3 is a cross sectional view of the semiconductor device 1 taken along the line B-B shown in FIG. 1.

As illustrated in FIGS. 1 to 3, the semiconductor device 1 is provided with a substrate 2, an element portion 20, and an electrode portion 30.

The substrate 2 where the element portion 20 is formed is made of, for example, n+ type semiconductor.

Referring to FIG. 2, the element portion 20 includes an epitaxial layer 3, a base region 4, a source region 5, a trench 6, a gate insulating film 8, a drain electrode 9, and an insulating film 10.

The epitaxial layer 3 is provided on one surface of the substrate 2. The epitaxial layer 3 is made of, for example, n− type semiconductor.

The base region 4 is provided on the surface of the epitaxial layer 3. The base region 4 is made of, for example, p-type semiconductor.

The source region 5 is provided on the surface of the base region 4. The source region 5 is made of, for example, n+ type semiconductor.

Trenches 6 penetrate through the base region 4 and the source region 5, and extend into the epitaxial layer 3. The trenches 6 extend in the Y direction. A plurality of the trenches 6 are provided at predetermined intervals from one another.

The gate insulating film 8 is provided inside each of the plural trenches 6. The gate insulating film 8 is provided to cover a trench gate 7 inside the trench 6.

The drain electrode 9 is provided on the opposite side of the substrate 2 from the side where the epitaxial layer 3 is formed thereon. The drain electrode 9 is made of, for example, metal such as aluminum (Al).

An insulating film 10 is provided on the epitaxial layer 3. The insulating film 10 has an opening. The insulating film 10 may be a single layer film or a stacked layer film.

Since well-known technique can be applied to the material, size, shape and manufacture of the substrate 2, epitaxial layer 3, base region 4, source region 5, trench 6, gate insulating film 8, drain electrode 9, and insulating film 10, their detailed descriptions are omitted.

The electrode portion 30 is formed over the substrate 2, and it includes a gate electrode 31, a source electrode 32, and an insulating layer 39.

The gate electrode 31 includes a main unit 31$a$, a wiring unit 31$b$ (FIG. 3), and the trench gate 7.

The main unit 31$a$ and the wiring unit 31$b$ of the gate electrode 31 are provided on the insulating film 10. The thickness of the insulating film 10 varies depending on a region where the film is present. For example, the thickness of the insulating film 10 in the region adjacent to the dicing line (where a die is cut from a wafer) is sometimes different from the thickness of the insulation film 10 in the region between the source electrode 32 and the gate electrode 31.

A trench gate 7 is provided inside each of the plural trenches 6.

As illustrated in FIG. 3, the trench gates 7 extend in the Y direction and penetrate through the gate insulating film 8 and the insulating film 10 in the Z direction, to be connected to the wiring unit 31$b$. The trench gates 7 are made of, for example, polysilicon with a dopant(s) added.

The main unit 31$a$ forms a gate pad and the wiring unit 31$b$ forms the gate connection wiring.

The source electrode 32 is provided on the opening where the source region 5 is exposed through the opening in the insulating film 10. The source electrode 32 becomes a source pad.

The main unit 31$a$ and the wiring unit 31$b$ of the gate electrode 31 and the source electrode 32 each include a barrier layer 33, a first metal layer 34, a barrier layer 35, a seed layer 36, a second metal layer 37, and a third metal layer 38. The barrier layer 33, the first metal layer 34, the barrier layer 35, the seed layer 36, the second metal layer 37, and the third metal layer 38 may be respectively each be formed as a single layer structure or a stacked layer structure including plural layers.

The barrier layer 33 provided in the main unit 31$a$ of the gate electrode 31 is provided on the insulating film 10.

The barrier layer 33 provided in the wiring unit 31$b$ of the gate electrode 31 is provided on the insulating film 10 and in the opening formed on the insulating film 10. The barrier layer 33 formed on the opening is connected to the trench gate 7.

As the thickness of the insulating film 10, in the region where the barrier layer 33 is provided the thickness may be different from the region adjacent to the dicing line and the region between the source electrode 32 and the gate electrode 31.

The barrier layer 33 formed in the source electrode 32 is provided on the opening formed in the insulating film 10. The barrier layer 33 provided on the opening is connected to the source region 5.

The barrier layer 33 can be made of, for example, titanium (Ti), titanium tungsten (TiW), and titanium nitride (TiN).

The thickness of the barrier layer 33 can be set at, for example, about 300 nm to 500 nm.

The first metal layer 34 is provided on the barrier layer 33.

The first metal layer 34 can be made of, for example, aluminum (Al), Al—Si, Al—Si—Cu, and Al—Cu.

The thickness of the first metal layer 34 can be set at, for example, about 1 μm to 2 μm.

The above mentioned barrier layer 33 is provided in order to isolate the first metal layer 34 and the second metal layer 37 from the element portion 20 (the epitaxial layer 3 and the substrate 2). Further, the barrier layer 33 is used in order to restrain the elements included in the first metal layer 34 and the second metal layer 37 from diffusing into the element portion 20. Furthermore, the barrier layer 33 is used in order to restrain the elements included in the first metal layer 34 and the second metal layer 37 from reacting with the elements included in the element portion 20 where the first metal layer 34 and the second metal layer 37 are the same material, the barrier layer 33 is not required.

The barrier layer 35 is provided on the first metal layer 34.

The barrier layer 35 can be made of, for example, titanium (Ti), titanium tungsten (TiW), titanium nitride (TiN), tungsten (W), tantalum (Ta), tantalum nitride (TaN), and ruthenium (Ru).

The thickness of the barrier layer 35 can be set at, for example, about 100 nm to 300 nm.

The barrier layer 35 is provided in order to restrain the element included in the second metal layer 37 from diffusing into the element portion 20 (the epitaxial layer 3 and the substrate 2), together with the above mentioned barrier layer 33 and the first metal layer 34, and in order to restrain the element included in the second metal layer 37 from reacting with the elements included in the element portion 20.

Therefore, in the case of an element type that is included in the second metal layer 37, at least one of the barrier layer 33, the first metal layer 34, and the barrier layer 35 may be provided.

The barrier layer 35 is provided in order to restrain a diffusion of the element included in the second metal layer 37 into the above mentioned first metal layer 34 and to restrain their mutual reaction. Therefore, where the second metal layer 37 and the first metal layer 34 are the same material, the barrier layer 35 does not have to be provided.

However, in the case of an element having a large diffusion coefficient such as copper, the element easily diffuses inside the element portion 20; therefore, if the element included in the second metal layer 37 is copper or the like, it is desirable to form the barrier layer 33 between the first metal layer 34 and the barrier layer 35.

A seed layer 36 is provided on the barrier layer 35. The seed layer 36 can be made of, for example, copper. The seed layer 36 forms a conductive layer used in forming the second metal layer 37 by electroplating. On the contrary, in the case of forming the second metal layer 37 by electroless plating, the seed layer 36 can be omitted.

Even where the second metal layer 37 is formed by electroplating, the barrier layer 33, the first metal layer 34, and the barrier layer 35 can supply a current and voltage necessary for the electroplating to the surface layer, and if the adhesion of the formed second metal layer 37 to a base can be secured, the seed layer 36 can be omitted.

The second metal layer 37 is provided on the seed layer 36.

The second metal layer 37 can be made of, for example, conductive material such as copper.

The thickness of the second metal layer 37 can be set at, for example, about 5 µm to 10 µm.

The third metal layer 38 covers the exposed surface (the top surface and the lateral surface) of the stacked body including the barrier layer 33, the first metal layer 34, the barrier layer 35, the seed layer 36, and the second metal layer 37.

The third metal layer 38 can be made of a metal which is less likely to oxidize or react when exposed to an ambient atmosphere, i.e., having a smaller oxidation tendency than that of the element (for example, copper) included in the second metal layer 37.

The third metal layer 38 may include at least one element selected from a group including, for example, gold, platinum (Pt), and palladium (Pd).

The thickness of the third metal layer 38 can be set at, for example, about 0.05 µm.

Further, a base layer made of Ni/Pd, nickel (Ni), tin (Sn) and the like with a thickness of about 1 µm to 2 µm can be provided between the third metal layer 38 and the second metal layer 37.

An insulating layer 39 covers the surface of the third metal layer 38, except at an opening therein. In this opening, the third metal layer 38 formed over the top surface of the second metal layer 37 is exposed.

The insulating layer 39 can be made of, for example, PI (polyimide), permanent resist, P—SiN, or P—SiO. The insulating layer 39 may be formed in a single layer film or a stacked layer film.

The thickness of the insulating layer 39 can be set to, for example, about 1 µm to 20 µm.

The insulating layer 39 is provided in order to protect the gate electrode 31 and the source electrode 32. The insulating layer 39 can be provided according to need.

In the semiconductor device 1 according to the embodiment, the third metal layer 38 covers the whole lateral wall of the stacked body including the barrier layer 33, the first metal layer 34, the barrier layer 35, the seed layer 36, and the second metal layer 37. Therefore, reliability can be improved.

Second Embodiment

FIGS. 4A to 6D are cross sectional views in each process when forming the element portion of the semiconductor device 1 according to the first embodiment.

Further, FIGS. 4A to 6D are cross sectional views in each process taken along the line A-A in FIG. 1.

Figure 4A:
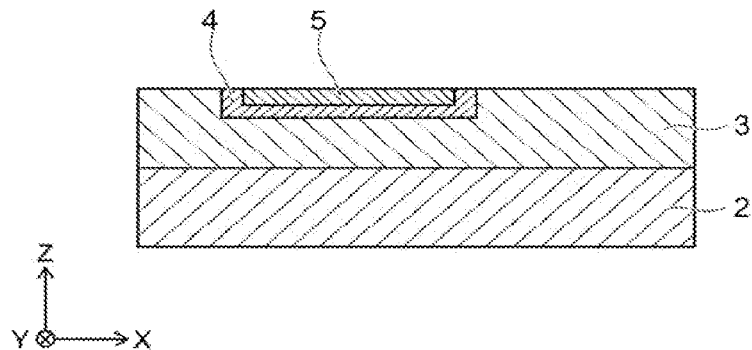
FIGS. 4A-4C are cross sectional views showing a process of forming an element portion of the semiconductor device according to the first embodiment.
Figure 4B:
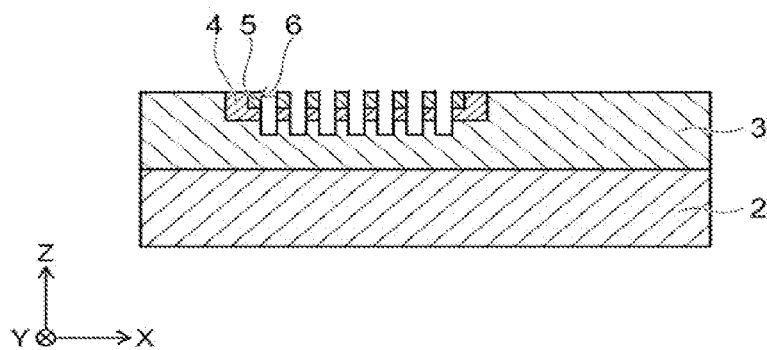
Figure 4C:
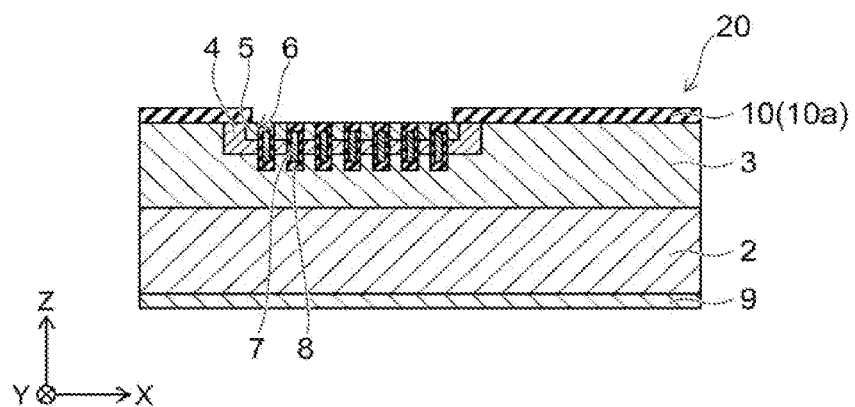
Figure 5A:
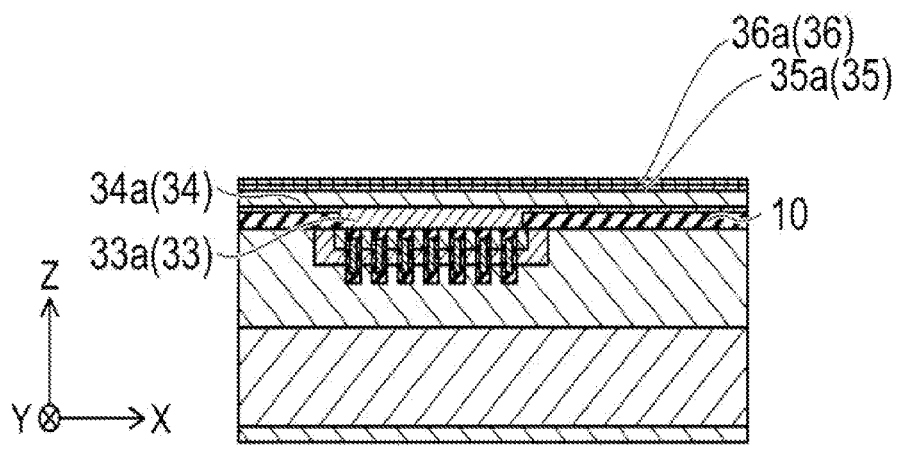
FIGS. 5A-5D are cross sectional views showing a process of forming the element portion of the semiconductor device according to the first embodiment.
Figure 5B:
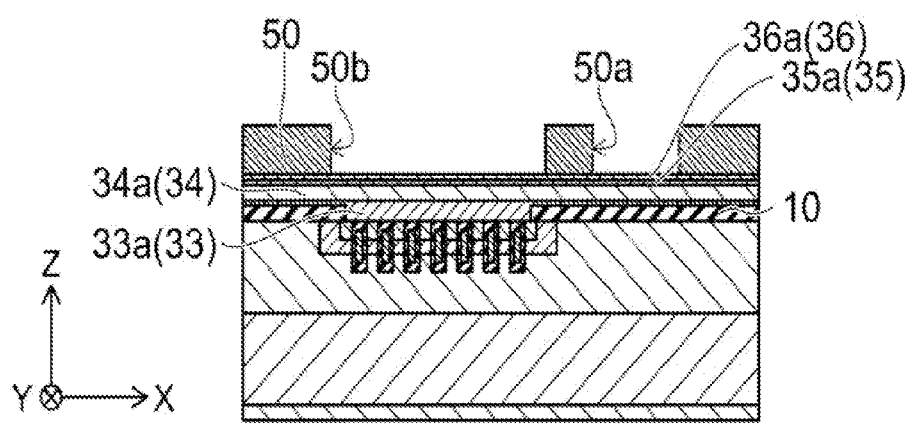
Figure 5C:
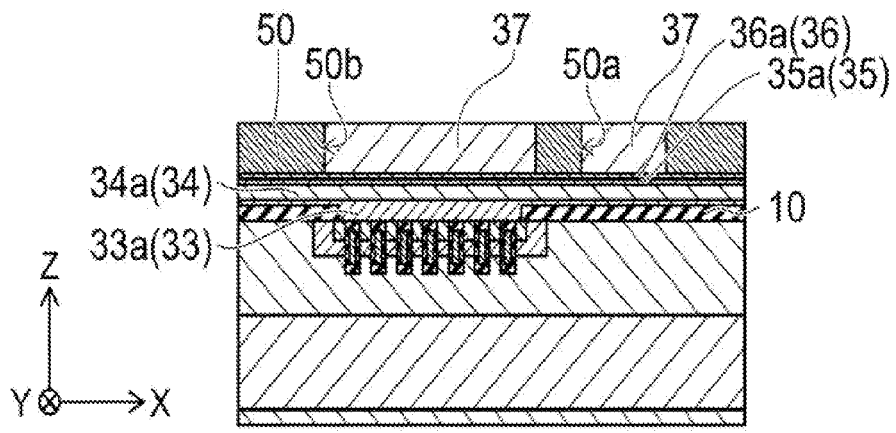
Figure 5D:
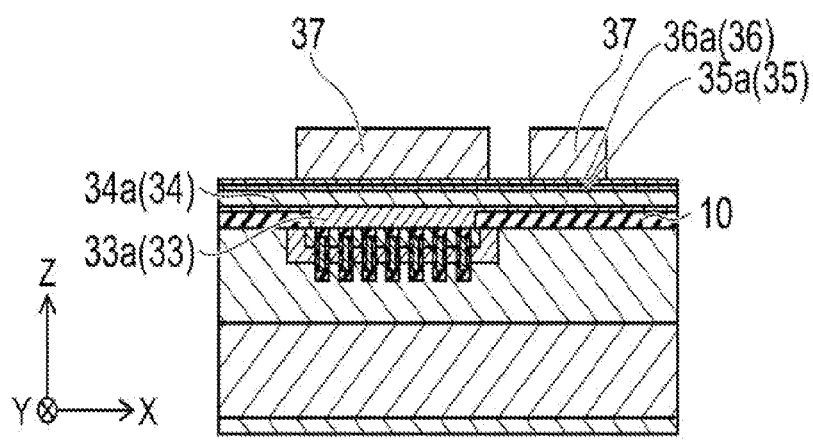
Figure 6A:
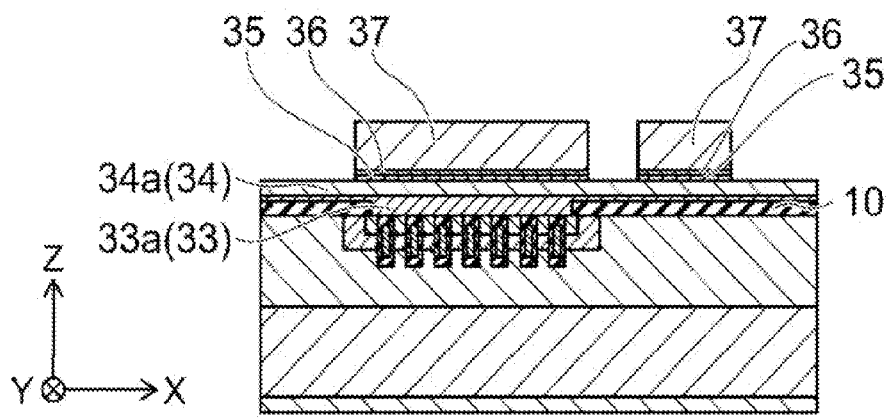
FIGS. 6A-6D are cross sectional views showing a process of forming the element portion of the semiconductor device according to the first embodiment.

FIG. 5A is a cross sectional view in the process following the process of FIG. 4C, and FIG. 6A is a cross sectional view in the process following the process of FIG. 5D.

FIGS. 4A to 4C are cross sectional views in each process for illustrating the formation of the element portion 20. FIGS. 5A to 6D are cross sectional views in each process for illustrating the formation of the electrode portion 30.

The formation of the element portion 20 will be described at first.

As illustrated in FIG. 4A, an n− type semiconductor is epitaxially grown on the substrate 2 made of the n+ type semiconductor, to form the epitaxial layer 3 made of the n− type semiconductor.

Then, a mask pattern having a desired opening is formed on the epitaxial layer 3.

A p type impurity is implanted in the epitaxial layer 3 through the opening of the mask pattern and thermally diffused, hence to form the base region 4 made of the p type semiconductor.

Then a mask pattern having a desired opening is formed on the base region 4.

An n type impurity is implanted in the base region 4 through the opening of the mask pattern and thermally diffused, hence to form the source region 5 made of the n+ type semiconductor.

After the trenches 6 described later are formed, the base region 4 and the source region 5 can be formed.

Next, as illustrated in FIG. 4B, the mask pattern having desired openings is formed on the epitaxial layer 3, the base region 4, and the source region 5, to then etch the trenches 6 according to the RIE (Reactive Ion Etching). The trenches 6 penetrate through the base region 4 and the source region 5, and extend inwardly of the epitaxial layer 3. The trench 6 extends in the Y direction of FIG. 4B.

As illustrated in FIG. 4C, the gate insulating film 8 is formed along the inner walls of the trenches 6 and, thereafter, doped polysilicon is deposited over the gate insulating film 8.

The polysilicon exposed in the region where the source electrode 32 is formed is etched back, to form the trench gate 7.

The etched back portion of the polysilicon is then covered with an insulative material, to form the gate insulating film 8 covering the trench gate 7 is formed.

Then, the insulating film 10 is formed on the epitaxial layer 3, the base region 4, the source region 5, and the gate insulating film 8. The gate insulating film 8 and a film 10a (a film to become the insulating film 10) can be made of oxide doped with impurity such as silicon oxide ($SiO_2$), silicon nitride (SiN), TEOS (Tetra Ethyl Ortho Silicate), BPSG (Boron Phosphorus Silicon Glass), and PSG (Phosphorus Silicon Glass). The thickness of the film 10a can be set at, for example, 500 nm to 1000 nm.

The insulative material embedded in the polysilicon etched back portion can be formed simultaneously with the insulating film 10.

A mask pattern having a desired opening is formed on the film 10a and by forming the opening in the region where the wiring 31b of the gate electrode 31 and the source electrode 32 are formed, and using RIE, apertures in the insulating film 10 are formed.

The drain electrode 9 made of metal such as aluminum is formed on the opposite side of the substrate 2 to the side where the epitaxial layer 3 is provided. The drain electrode 9 (FIG. 2) may be formed, for example, after the insulating film 10 is formed, or before the epitaxial layer 3 is formed, or when the first metal layer 34 described later is formed, or after the insulating layer 39 is formed.

The method of forming the element portion 20 is not restricted to the above mentioned procedure, but other well-known techniques can be used to form the element portion 20 in the well-known structure. For example, well known techniques can be applied to the material, size, shape, film formation method, and etching method of the substrate 2, epitaxial layer 3, base region 4, source region 5, trench 6, trench gate 7, gate insulating film 8, drain electrode 9, and insulating film 10. Therefore, the detailed description about the structure and the formation method of the element portion 20 is omitted.

Next, the formation of the electrode portion 30 will be described by way of example.

At first, as illustrated in FIG. 5A, a film 33a that forms the barrier layer 33 is deposited on the insulating film 10 and within the opening in the insulating film 10.

The film 33a can be formed, for example, by physical vapor deposition or sputtering.

The material of the film 33a may be, for example, titanium, titanium tungsten, and titanium nitride.

The thickness of the film 33a can be set at, for example, about 300 nm to 500 nm.

Continuously, a film 34a that forms the first metal layer 34 is deposited on the film 33a.

The film 34a can be formed, for example, using a physical vapor deposition or sputtering process.

The film 34a may be made of, for example, aluminum, Al—Si, Al—Si—Cu, and Al—Cu.

The thickness of the film 34a can be set at, for example, about 1 μm to 2 μm.

Next, a film 35a that becomes the barrier layer 35 is formed on the film 34a.

The film 35a can be formed, for example, by sputtering.

The film 35a may be made of, for example, titanium, titanium tungsten, titanium nitride, tungsten, tantalum, tantalum nitride, and ruthenium.

The thickness of the film 35a can be set at, for example, about 100 nm to 300 nm.

A film 36a that becomes the seed layer 36 is formed on the film 35a.

The film 36a can be formed, for example, by the sputtering or physical vapor deposition method.

The film 36a may be, for example, copper.

As illustrated in FIG. 5B, an insulating layer 50 (corresponding to an example of the first insulating layer) is formed on the film 36a.

In forming the insulating layer 50, openings 50a and 50b are formed, for example, using photolithography.

The opening 50a is formed in a region where the main unit 31a and the wiring unit 31b of the gate electrode 31 are formed.

The opening 50b is formed in a region where the source electrode 32 is formed.

The insulating layer 50 can be made of, for example, photoresist.

The thickness of the insulating layer 50 can be set thicker than, for example, that of the second metal layer 37. The thickness of the insulating layer 50 can be set at, for example, about 5 μm to 15 μm.

As illustrated in FIG. 5C, the second metal layer 37 is formed inside the openings 50a and 50b of the insulating layer 50.

The second metal layer 37 can be formed, for example, by a plating process.

When the second metal layer 37 is formed by electroplating, the film 36a or the film 34a can be the cathode. The second metal layer 37 can also be formed by electroplating.

As illustrated in FIG. 5D, the insulating layer 50 is then removed.

The insulating layer 50 can be removed, for example, by dry ashing and dissolution using a liquid solution.

As illustrated in FIG. 6A, using the second metal layer 37 as a mask, the films 35a and 36a are etched away in the openings, leaving the seed layer 36 and the barrier layer 35 below the second metal layer 37.

The film 36a and the film 35a can be removed with an etching species having a higher selectivity to the film 36a and the film 35a than to the second metal layer 37 (the etching rate of the film 36a and the film 35a are significantly higher than the etching rate of the second metal layer 37). For example, the film 36a and the film 35a can be removed using wet etching with an etching species having a high selective ratio of the film 36a and film 35a compared to the etching rate of the second metal layer 37; alternatively, the film 36a and the film 35a can be removed using a dry etching technique such as RIE.

When the thickness of the second metal layer 37 is substantially larger than the thickness of the film 36a and the film 35a, the etching species having the same selectivity to the film 36a and the film 35a to the second metal layer 37 can be used.

Figure 6B:
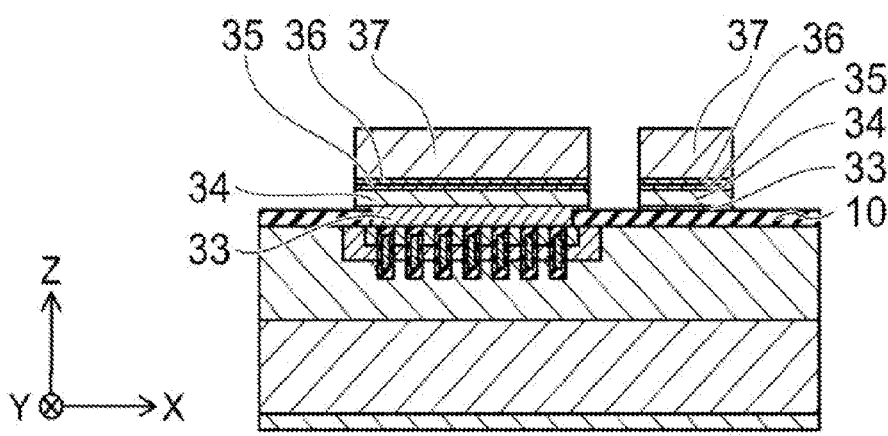

As illustrated in FIG. 6B, using the second metal layer 37 used as a mask, the film 34a is removed to form the first metal layer 34 and the film 33a is removed to form the barrier layer 33.

The film 34a and the film 33a can be removed with etching species having a higher selectivity ratio to etch the film 34a and the film 33a compared to the second metal layer 37 (the etching rate of the film 34a and the film 33a/the etching rate of the second metal layer 37); for example, they may be removed by wet etching using an alkali etching solution or an acid etching solution, or by dry etching such as an RIE process.

When the thickness of the second metal layer 37 is significantly larger than that of the film 36a and the film 35a, an etching species having the same selectivity to the film 36a and the film 35a as to the second metal layer 37 can be used.

The processing shown in FIG. 6A and the processing shown in FIG. 6B can be performed sequentially as a continuous process (the process in series).

Namely, with the second metal layer 37 used as a mask, the film 36a is removed to the seed layer 36, the film 35a is removed to the barrier layer 35, the film 34a is removed to the first metal layer 34, and the film 33a is removed to the barrier layer 33.

Figure 6C:
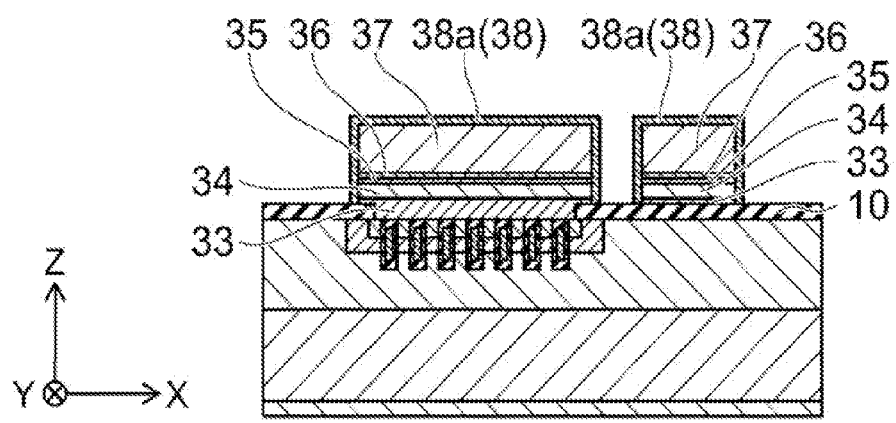

Then, as illustrated in FIG. 6C, a film 38a that becomes the third metal layer 38 is formed to cover the exposed surfaces of the stacked body including the barrier layer 33, the first metal layer 34, the barrier layer 35, the seed layer 36, and the second metal layer 37. Here, a base layer may be formed so as to cover the exposed surface of the stacked body and then the film 38a may be formed on the base layer.

For example, the base layer including Ni/Pd, nickel, and tin is formed and the film 38a that becomes the third metal layer 38, made of gold, palladium, and platinum, is formed on the base layer. The thickness of the base layer can be set at about 1 μm to 2 μm and the thickness of the film 38a can be set at about 0.05 μm.

The base layer and the film 38a can be formed according to the electroless plating.

In this case, the stacked body including the barrier layer 33, the first metal layer 34, the barrier layer 35, the seed layer 36, and the second metal layer 37 is cover the insulating film 10, except for the exposed surface thereof. Therefore, the base layer and the film 38a are restrained from forming in the portion other than the exposed surface of the stacked body.

Figure 6D:
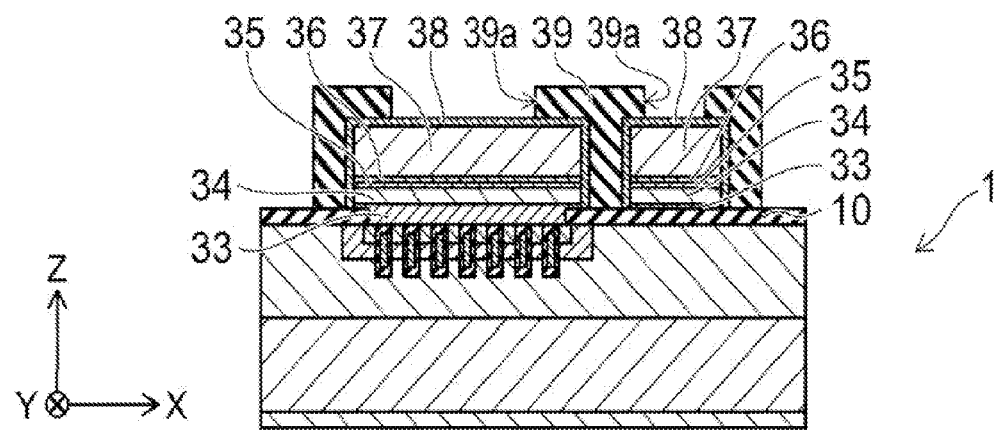

As illustrated in FIG. 6D, an insulating layer 39 is formed to cover the surface of the third metal layer 38.

Then an opening 39a is formed to expose the third metal layer 38 provided on the top surface of the second metal layer 37.

The insulating layer 39 can be made of, for example, PI (polyimide), permanent resist (hardmask), P—SiN, and P—SiO. The insulating layer 39 may be formed in a single layer film or a stacked layer film.

The insulating layer 39 can be formed, for example, using plasma CVD (plasma-enhanced chemical vapor deposition), printing, and photolithography.

The thickness of the insulating layer 39 can be set at, for example, about 1 μm to 20 μm.

The insulating layer 39 for protecting the gate electrode 31 and the source electrode 32 is formed depending on need.

As mentioned above, the electrode portion 30 can be formed.

According to the semiconductor device manufacturing method of the embodiment, the number of manufacturing processes can be reduced without changing the reliability of the device.

Third Embodiment

Figure 7A:
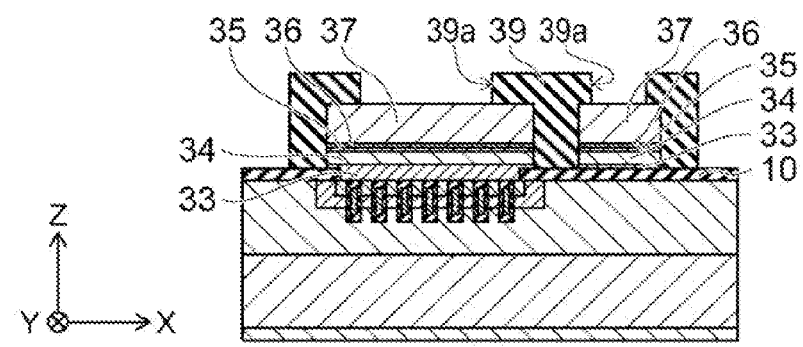
FIGS. 7A-7C are cross sectional views showing a process of forming an element portion of a semiconductor device.
Figure 7B:
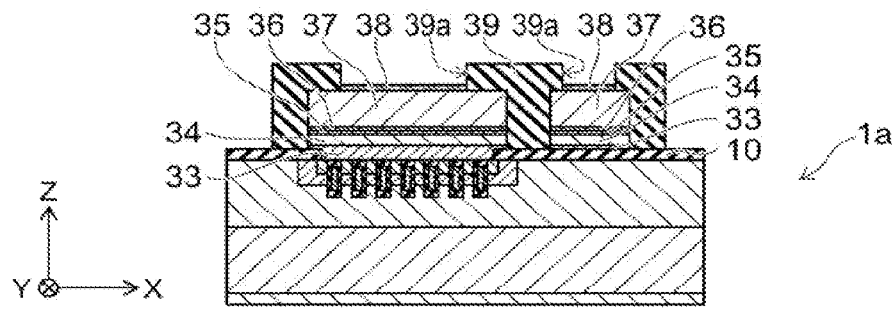
Figure 7C:
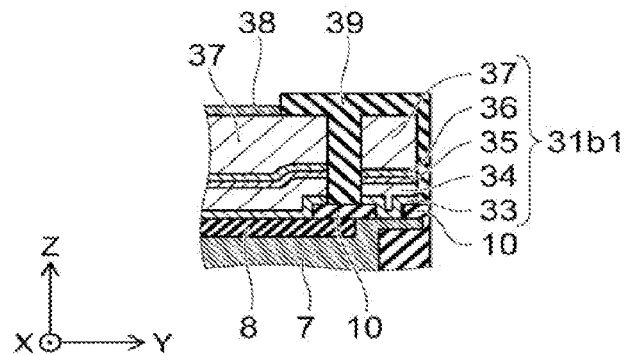

FIGS. 7A to 7C are cross sectional views in each process when forming an element portion of a semiconductor device 1a.

FIGS. 7A and 7B show the processes following the above process shown in FIG. 6B.

Namely, in the manufacturing method of the semiconductor device 1a according to this embodiment, the processes used to form the structures illustrated in FIGS. 7A and 7B are performed after the processes used to form the structures illustrated in FIGS. 4A to 6B.

FIG. 7C is a cross sectional view of a portion taken along the line B-B in FIG. 1. Namely, it is a schematic view corresponding to FIG. 3.

After the first metal layer 34 and the barrier layer 33 are formed, as illustrated in FIG. 6B, the insulating layer 39 (corresponding to an example of the second insulating layer) is formed to cover the surface of the stacked body including the barrier layer 33, the first metal layer 34, the barrier layer 35, the seed layer 36, and the second metal layer 37, as illustrated in FIG. 7A.

Here, the opening 39a is formed to expose a part of the top surface of the second metal layer 37.

Next, as illustrated in FIG. 7B, the third metal layer 38 is formed on the exposed portions of the second metal layer the opening 39a. However, as illustrated in FIG. 7C, the third metal layer 38 is not formed on the top surface of the second metal layer 37 of a wiring unit 31b1 because it is covered by the insulating layer 39.

When forming the third metal layer 38, a base layer made of, for example, Ni/Pd, nickel, tin and the like, is formed, and a film made of gold, palladium, platinum and the like is formed on the base layer, hence to form the third metal layer 38. In this case, the thickness of the base layer can be set at about 1 µm to 2 µm, and the thickness of the film on the base layer can be set at about 0.05 µm. The base layer and the film on the base layer can be formed by electroless plating.

As illustrated in FIGS. 7B and 7C, the semiconductor device 1a is provided with the substrate 2, the element portion 20, and the electrode portion 30.

The semiconductor device 1a is provided with the insulating layer 39 which covers the surface of the stacked body including the barrier layer 33, the first metal layer 34, the barrier layer 35, the seed layer 36, and the portion of the second metal layer 37 not exposed in the opening 39a above the second metal layer 37.

The third metal layer 38 is provided in the opening 39a. The third metal layer 38 includes a more stable metal, i.e., one less likely to oxidize, as compared to the second metal layer 37. However, as illustrated in FIG. 7C, the third metal layer 38 is not formed on the top surface of the second metal layer 37 of the wiring unit 31b1.

Namely, the semiconductor device 1a is provided with the substrate 2 where the element portion 20 is formed, the first metal layer 34 including aluminum and the like, which is formed on the substrate 2, the second metal layer 37 including copper and the like, which is formed on the first metal layer 34, the third metal layer 38 including a metal having a smaller oxidation tendency than that of the second metal layer 37, which is formed on the second metal layer 37, and the insulating layer 39 which covers the exposed surface of the first metal layer 34 and the second metal layer 37.

In the semiconductor device 1a according to the embodiment, the whole lateral side of the stacked body including the barrier layer 33, the first metal layer 34, the barrier layer 35, the seed layer 36, and the second metal layer 37 is covered with the insulating layer 39. Further, the top surface of the second metal layer 37, where the insulator is open to expose the second metal layer, is covered with the third metal layer 38. Therefore, the reliability of the resulting structure can be improved. According to this structure, the number of the manufacturing processes can be reduced.

FIGS. 8A to 8D are cross sectional views in each process when forming an element portion of a semiconductor device 101 according to a comparison example.

FIGS. 8A to 8D show the processes corresponding to the above mentioned processes of FIGS. 6A to 6D.

Figure 8A:
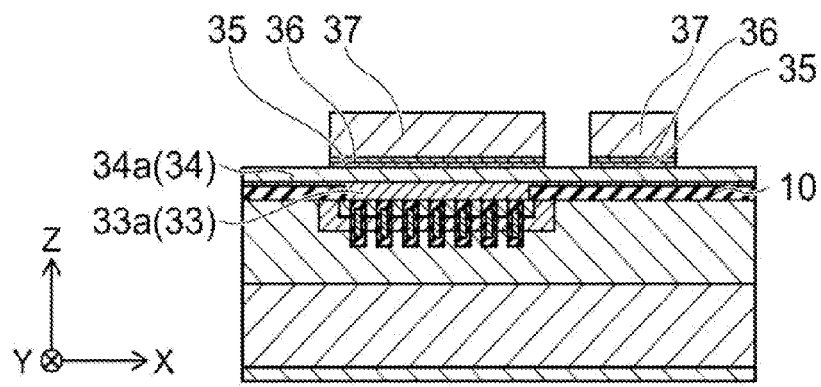
FIGS. 8A-8D are cross sectional views showing a process of forming an element portion of a semiconductor device according to a comparison example.

In the manufacturing method of the semiconductor device 101 according to the comparison example, as illustrated in FIG. 8A, with the second metal layer 37 used as a mask, the films 36a leaving the seed layer 36 and the film 35a are removed leaving the barrier layer 35 in the openings in the metal layer 37.

Figure 8B:
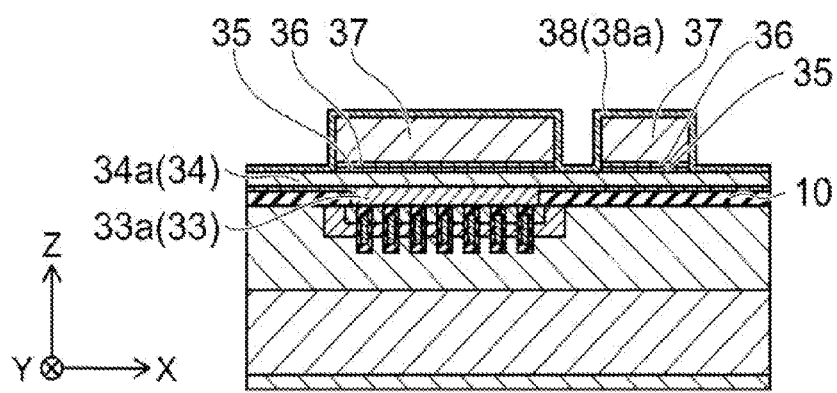

Then, as illustrated in FIG. 8B, the base layer and the film 38a that becomes the third metal layer 38 are formed to cover the exposed surface of the stacked body including the barrier layer 35, the seed layer 36, and the second metal layer 37.

For example, the base layer made of Ni/Pd, nickel, tin and the like is formed and the film 38a that becomes the third metal layer 38, made of gold, palladium, platinum and the like is formed on the base layer.

In this case, the base layer and the film 38a are formed also in the exposed surface of the film 34a.

Figure 8C:
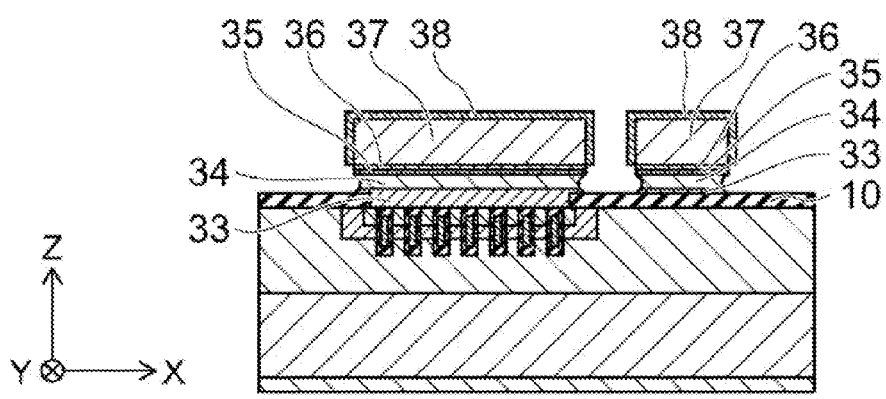

As illustrated in FIG. 8C, the stacked body where the base layer and the film 38a are formed is used as the mask to remove the film 38a and the base layer formed on the exposed surface of the film 34a, remove the film 34a leaving the first metal layer 34, and further eliminate the film 33a leaving the barrier layer 33.

Figure 8D:
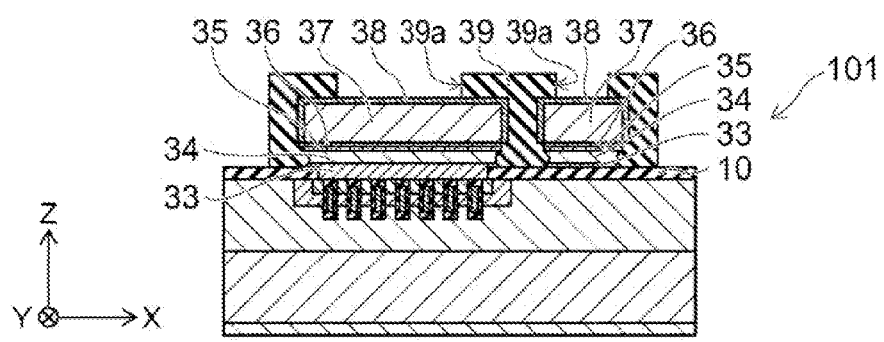

As illustrated in FIG. 8D, the insulating layer 39 is formed in order to cover the surface of the third metal layer 38.

Here, the opening 39a is formed to expose the third metal layer 38 provided on the top surface of the second metal layer 37.

As mentioned above, the semiconductor device 101 according to the comparison example can be manufactured.

In the manufacturing of the semiconductor device 101 according to the comparison example, the second metal layer 37 is formed by electroplating or electroless plating and therefore, the thickness thereof can be increased.

Here, since the film 34a is made of a metal such as aluminum, the film 38a and the base layer formed on the exposed surface of the film 34a are increased in volume.

The film 38a is made of gold and the like and the base layer is made of Ni/Pd and the like. When the film 38a, the base layer, and the film 34a are removed by wet etching of a high manufacturing efficiency, although the easily removed film 34a can be removed, a part of the film 38a and the base layer remains as a residual. If a part of the film 38a and the base layer remain, there is a fear of deteriorating the reliability of the semiconductor device 101.

Further, the lateral wall of the formed first metal layer 34 is not covered with the third metal layer 38. Therefore, if the wet etching is conditioned to avoid a part of the film 38a and base layer from remaining as the residual, there is a fear of eroding the lateral wall of the easily removed film 34a (first metal layer 34). When the lateral wall of the first metal layer 34 is eroded, the reliability of the semiconductor device 101 may be deteriorated.

On the contrary, according to the manufacturing method of the semiconductor devices 1 and 1a of the embodiments, as having been described in FIG. 6C and FIG. 7B, a part of the hardly removable film 38a and base layer does not remain as a residual.

As mentioned above, the process illustrated in FIG. 6A and the process illustrated in FIG. 6b can be performed in the same process.

Therefore, the semiconductor devices 1 and 1a of high reliability can be manufactured in the less number of the manufacturing processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first metal layer on a substrate adjacent a device element;
    forming a first insulating layer on the first metal layer, having an opening;
    forming a second metal layer in the opening of the first insulating layer;
    removing the first insulating layer to thereby expose regions of the first metal layer;
    removing exposed portions of the first metal layer using the second metal layer as a mask while leaving the portion of the first metal layer between the second metal layer and the underlying substrate; and
    forming an electrode portion by covering exposed surfaces of at least the second metal layer with a third metal layer including a metal having a higher oxidation resistance than the first and the second metals after removing the exposed portions of the first metal layer.

2. The method of manufacturing a semiconductor device of claim 1, wherein a second insulating layer is formed over the first and second metal layers.

3. The method of manufacturing a semiconductor device of claim 2, further including:
    forming an opening in the second insulating layer; and
    exposing the surfaces of the second metal layer in the opening.

4. The method of manufacturing a semiconductor device of claim 3, further including:
    depositing the third metal layer over the first metal layer and the second metal layer before forming the second insulating layer.

5. The method of manufacturing a semiconductor device of claim 3, wherein the underlying substrate includes a barrier layer on which the first metal layer is formed.

6. The method of manufacturing a semiconductor device of claim 5, wherein, during the step of removing the portions of the first metal layer using the second metal layer as a mask an opening is opened which extends to a third insulating layer located on the substrate.

7. The method of manufacturing a semiconductor device of claim 1, wherein
    the first metal layer includes aluminum, and
    the second metal layer includes copper.

8. The method of manufacturing a semiconductor device of claim 1, wherein
    during removal of the portions of the first metal layer with the second metal layer used as a mask,
    the etching species used for the removal of the first metal species has a higher selectivity to the first metal layer than to the second metal layer.

9. The method of manufacturing a semiconductor device of claim 1, wherein
    the third metal layer includes at least one metal selected from the group consisting of gold (Au), platinum (Pt), and palladium (Pd).

10. A method of manufacturing a semiconductor device, comprising:
    forming a device element on a substrate of a first conductivity type; the device element including:
        an epitaxial layer of a second conductivity that is different than the first conductivity type;
        a base layer of a third conductivity type that is different than the first conductivity type and the second conductivity type;
        a source region of the first conductivity type formed on the base layer; and
        an insulating film formed on the base layer, the method further comprising:
    forming a first metal layer adjacent the device element;
    forming a first insulating layer on the first metal layer, the first insulating layer having an opening;
    forming a second metal layer in the opening of the first insulating layer;
    removing the first insulating layer to thereby expose regions of the first metal layer;
    removing exposed portions of the first metal layer using the second metal layer as a mask while leaving the portion of the first metal layer between the second metal layer and the underlying substrate; and
    forming an electrode portion by covering exposed surfaces of at least the second metal layer with a third metal layer including a metal having a higher oxidation resistance than the first and the second metals.

11. The method of manufacturing a semiconductor device of claim 10, wherein a second insulating layer is formed over the first and second metal layers.

12. The method of manufacturing a semiconductor device of claim 11, further including:
    forming an opening in the second insulating layer; and
    exposing the surfaces of the second metal layer in the opening.

13. The method of manufacturing a semiconductor device of claim 12, further including:
    depositing the third metal layer over the first metal layer and the second metal layer before forming the second insulating layer.

14. The method of manufacturing a semiconductor device of claim 12, wherein the underlying substrate includes a barrier layer on which the first metal layer is formed.

15. The method of manufacturing a semiconductor device of claim 14, wherein, during the step of removing the portions of the first metal layer using the second metal layer as a mask an opening is opened which extends to a third insulating layer located on the substrate.

16. The method of manufacturing a semiconductor device of claim 10, wherein
the first metal layer includes aluminum, and
the second metal layer includes copper.

17. The method of manufacturing a semiconductor device of claim 10, wherein
during removal of the portions of the first metal layer with the second metal layer used as a mask,
the etching species used for the removal of the first metal species has a higher selectivity to the first metal layer than to the second metal layer.

18. The method of manufacturing a semiconductor device of claim 10, wherein
the third metal layer includes at least one metal selected from the group consisting of gold (Au), platinum (Pt), and palladium (Pd).

* * * * *